(12) United States Patent
Osada et al.

(10) Patent No.: US 6,773,247 B1
(45) Date of Patent: Aug. 10, 2004

(54) DIE USED FOR RESIN-SEALING AND MOLDING AN ELECTRONIC COMPONENT

(75) Inventors: Michio Osada, Kyoto (JP); Keiji Maeda, Kyoto (JP); Yoshihisa Kawamoto, Kyoto (JP); Yoshiji Shimizu, Osaka (JP); Toshiyuki Nishimura, Osaka (JP); Susumu Yamahara, Osaka (JP)

(73) Assignees: Towa Corporation, Kyoto (JP); Shimizu Co., Ltd., Osaka (JP)

( * ) Notice: Subject to any disclaimer, the term of this patent is extended or adjusted under 35 U.S.C. 154(b) by 238 days.

(21) Appl. No.: 09/705,237

(22) Filed: Nov. 2, 2000

(30) Foreign Application Priority Data

Nov. 9, 1999 (JP) .............................................. 11-317598

(51) Int. Cl.[7] .......................... B29C 70/72; B29C 45/02
(52) U.S. Cl. ......................... 425/89; 425/544; 425/123; 425/127; 249/115
(58) Field of Search .......................... 425/544, 89, 123, 425/127, 121; 249/115, 116; 264/272.14

(56) References Cited

U.S. PATENT DOCUMENTS 6,344,162 B1 * 2/2002 Miyajima .............. 264/272.14

FOREIGN PATENT DOCUMENTS

| JP | 56141922 | 11/1981 |
|---|---|---|
| JP | 58-212840 | * 12/1983 |
| JP | 01235620 | 9/1989 |
| JP | 03104874 | 5/1991 |
| JP | 08309803 | 11/1996 |
| JP | 10202698 | 8/1998 |
| JP | 10286845 | 10/1998 |
| KR | 92-977 | 1/1992 |

* cited by examiner

*Primary Examiner*—Robert Davis
*Assistant Examiner*—Thu Khanh T. Nguyen
(74) *Attorney, Agent, or Firm*—W. F. Fasse; W. G. Fasse

(57) ABSTRACT

A die used for molding an electronic component with resin includes a fixed, top die and a movable, bottom die and at least has a surface contacting a melted resin material that is electroplated with nickel-tungsten alloy. This plating can provide releaseability of a resin-molded body and the like superior to hard-chromium plating to allow an ejector pin to efficiently eject and release the resin-molded body from the die.

11 Claims, 2 Drawing Sheets

DIE USED FOR RESIN-SEALING AND MOLDING AN ELECTRONIC COMPONENT

BACKGROUND OF THE INVENTION

1. Field of the Invention

The present invention relates to an improvement of a die used for sealing an electronic component such as an integrated circuit (IC) with resin to mold the same.

2. Description of the Background Art

Conventionally, a transfer mold method is employed to seal with resin an electronic component mounted for example to a lead frame, to mold the electronic component. This method uses a resin-sealing and molding die formed of a top, fixed die; and a bottom, movable die (hereinafter referred to as "top and bottom dies") and is typically conducted as described below:

The top and bottom dies are previously heated by heating means to have a temperature at which resin is molded, and the top and bottom dies are opened. Then, a lead frame with an electronic component mounted thereto is fed and set in the bottom die's parting-line (P.L) plane (a die plane) at a predetermined position and a resin material is fed into a pot in the bottom die. Then, the bottom, movable die is moved upward and the both dies are closed, when the electronic component and the lead frame therearound are fit into upper and lower cavities respectively provided in the top and bottom dies on their respective one sides and facing each other and the resin material in the pot is heated and gradually melted. Then, the heated and melted resin material in the pot is introduced through a resin channel and thus injected into and fills the both of the upper and lower cavities and the electronic component and lead frame therearound in the upper and lower cavities are thus shielded with the resin and thus molded internal to a resin shielded body to correspond to the shape of the upper and lower cavities.

As such, after the passage of a period of time required for curing the melted resin material, the both dies are opened and an ejector pin provided in the both dies is employed to release the resin-molded body and lead frame in the upper and lower cavities and the resin cured in the resin channel.

The above, conventional die typically has a surface plated with hard chromium (HCr). As such, the upper and lower cavities both have a surface highly adhesive to a resin molded body. As such an ejector pin is not sufficient to eject and thus release the resin molded body from the cavities.

Furthermore, a resin molded body (a product) readily chips if an ejector pin is used to eject and thus release the resin molded body from the upper and lower cavities.

Furthermore, melted resin material readily enters the P.L plane of the dies and resin flash (the resin cured) remains and thus readily adheres. The adhering resin flash affects product size and the like and also enters the resin molded body to prevent uniform production of products.

Furthermore, if resin flash adheres to an air vent allowing the die cavity to externally communicate, the die cavity would be tightly sealed and cannot exhaust its internal air through the air vent. As such, the air in the die cavity is introduced into the resin molded body and the resin molded body would have a portion which is not filled with the resin.

Furthermore, to prevent resin flash from adhering a resin material is compounded with an increased amount of a mold release agent, although the mold release agent would degrade the adhesion between a surface of a lead frame made of metal and a resin molded body (the resin cured).

As such, there can hardly be obtained a high quality product (resin-molded body) that is highly reliable.

Furthermore, the die must have its surface frequently cleaned to remove resin flash remaining and thus adhering to the die surface. This would make the die surface cleaning difficult and time-consuming, resulting in an increased die molding cycle time.

Furthermore, in recent years with the necessity of changing to high-density surface-mounting, such mounting requires highly precise alignment and a product (a resin molded body) to be mounted is required to have a uniform size (a dimension with high precision). To provide the product with a uniform size, consideration is given to minimizing the contraction of a resin molded body when it is molded. For example, consideration is given to increasing the content of a filler such as hard powdery silica compounded in a resin material, to reduce the contraction thereof. In this technique, however, the hard powdery silica rapidly abrades the die surface and the die's durability degrades and the die's molding frequency also reduces. As such, the die must be replaced with a new die in a short period of time.

As such, the product is produced at a low level of productivity.

SUMMARY OF THE INVENTION

The present invention contemplates a die used for sealing an electronic component with resin to mold the electronic component, capable of improving the releaseability of a resin molded body with respect to the die to release the body from the die more efficiently.

The present invention also contemplates a die used for sealing an electronic component with resin to mold the electronic component, capable of providing a high quality product that is highly reliable.

The present invention also contemplates a die used for sealing an electronic component with resin to mold the electronic component, capable of enhancing the productivity for the product.

To achieve the above objects, the present invention provides the die used for sealing the electronic component with resin to mold the electronic component, having a coating layer of nickel-tungsten alloy on at least a surface thereof contacting a melted resin material when the resin is molded.

As such, there can be provided better releaseability of a resin-molded body with respect to the die to efficiently release the resin molded body.

The present invention in one embodiment provides the die used for sealing the electronic component with resin to mold the electronic component, wherein the coating layer is a plating layer formed of a nickel-tungsten alloy containing at least 20% by weight of tungsten.

The nickel-tungsten alloy (NiW) plating layer provided covering at least a surface contacting a melted resin material can provide better releaseability of a resin-molded body (or cured resin) than a surface processed by plating with hard chromium (HCr).

As such, the resin molded body can be efficiently ejected and released from the die cavities and the die can also be efficiently prevented from having resin flash (cured resin) adhering to its P.L plane or the like.

Furthermore, the surface provided with the NiW layer is greater in hardness than a surface processed with HCr. Thus, abrading and damaging the die can be minimized to enhance the durability of the die.

Consequently, the present invention can effectively provide a die used for sealing an electronic component with resin to mold the electronic component that is capable of providing a high-quality product that is highly reliable at a high level of productivity.

The present invention in one embodiment provides the coating layer (A) having a tungsten content of 20% by weight for the following reasons:

If a basic bathing of a nickel-tungsten alloy plating has a tungsten content below 20% by weight, e.g., 10% by weight, it would be a bathing which has a high temperature of 70 to 95° C. and is ammonium-alkaline with pH 8 to 9. This high-temperature bathing contains ammonium significantly volatile and it can thus hardly be controlled. The ammonium also smells bad and thus degrades the working environment of interest.

Furthermore, if coating layer (A) has a tungsten content of approximately 10% by weight then electrolysis rapidly increases the layer's electrostatic stress and also decreases the layer's flexibility. This results in a crack in a surface of the coating layer.

Furthermore, while the nickel-tungsten alloy plating as it is has a hardness of approximately Hv. 600, this plating after being heated and thus cured can be as hard as Hv. 1350. In contrast, if a nickel-tungsten alloy plating with a tungsten content of approximately 10% by weight is heated and thus cured, it does not cure in separation and can only have a hardness of approximately Hv. 600, i.e. the same hardness of such a plating which has not been further processed.

Furthermore, a nickel-tungsten alloy plating containing no less than 20% by weight of tungsten is advantageous in that it is not corroded by concentrated hydrochloric acid, sulfuric acid, hydrofluoric acid, or nitric acid.

It should be noted, however, that tungsten is not separated from a solution with its ions existing independently and an induced eutectoid reaction occurs. To allow tungsten to be separated through such an induced eutectoid reaction, tungsten is contained with an upper limit of approximately 60% by weight. As such, coating layer (A) provided on the surface that a melted resin material contacts in sealing and molding, preferably has a tungsten content of no more than 60% by weight.

Furthermore, coating layer (A) is preferably 1 $\mu$m to 20 $\mu$m in thickness, since coating layer (A) exceeding 20 $\mu$m in thickness has a spherical crystal and can thus not have a reliable surface and coating layer (A) less than 1 $\mu$m in thickness is too thin to effectively plate a surface.

The present invention can be applied to a resin-sealing and molding die for example including a fixed die, a movable die arranged opposite to the fixed die, upper and lower cavities provided in the fixed die and the movable die in their respective die planes to face each other along a parting-line plane of the fixed die and the movable die, for molding the resin, a concavity receiving and setting a support having the electronic component mounted thereto, a pot arranged at one of the fixed die and the movable die for supplying the resin material, a plunger fit internal to the pot for applying pressure to the resin, and a resin channel to allow the pot and the upper cavity to communicate with each other for transporting the melted resin material, wherein the coating layer is provided on an internal surface of the upper and lower cavities, an internal surface of the resin channel, an internal surface of the concavity, an internal surface of the pot, the parting-line plane of each of the fixed die and the movable die, and an external surface of the plunger.

Furthermore, if the die further includes an ejector pin ejecting and releasing from the upper and lower cavities a resin-molded body molded in the upper and lower cavities and an ejector pin fitting hole fitting the ejector pin therein, preferably the ejector pin has an external surface provided with the coating layer of nickel-tungsten alloy and/or the ejector pin fitting hole has an internal surface provided with the coating layer of nickel-tungsten alloy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
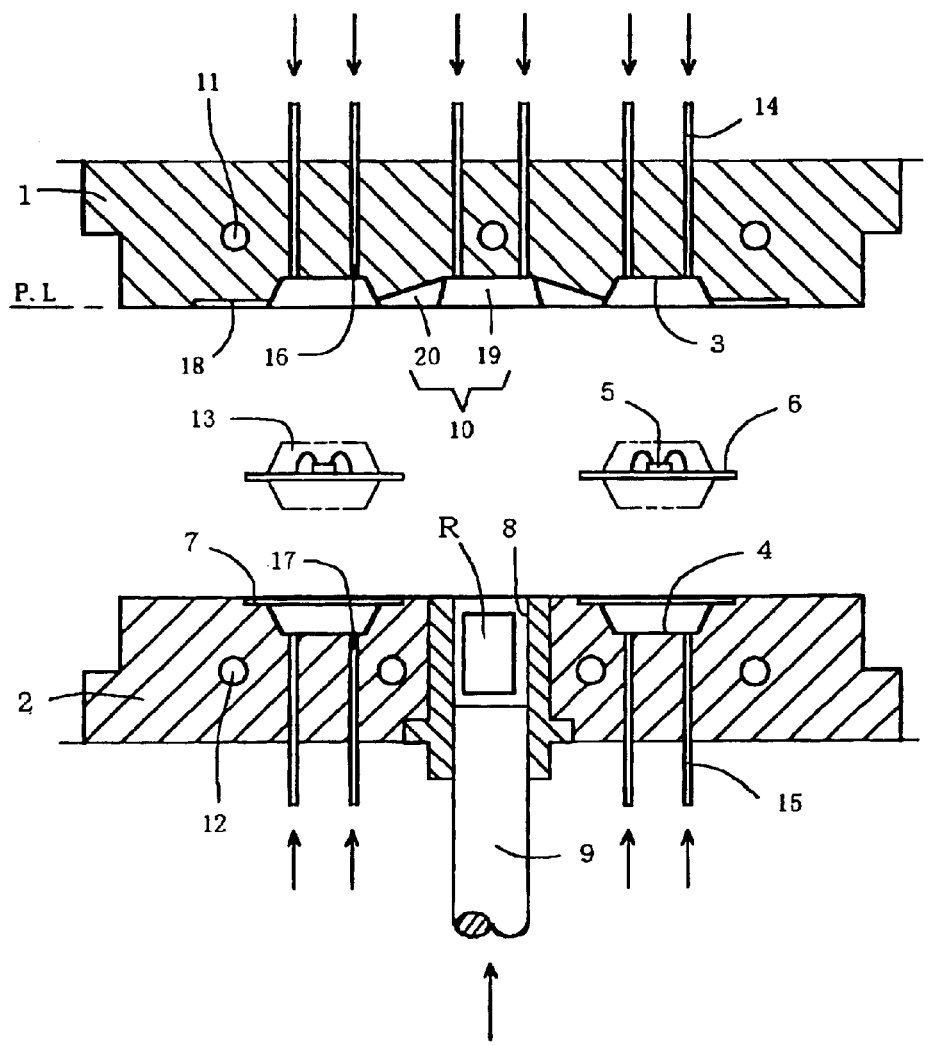
FIG. 1 is a schematic, partial vertical cross section of a die used for sealing an electronic component with resin to mold the electronic component in one embodiment of the present invention.

Hereinafter, one embodiment of the present invention will be described in detail with reference to FIGS. 1 and 2.

The present invention in one embodiment provides a die formed of a fixed, top die 1, a movable, bottom die 2 arranged opposite to top die 1, upper and lower cavities 3 and 4 provided in dies 1 and 2 in their respective die planes to face each other along the P.L plane of dies 1 and 2 for molding resin, a concavity 7 receiving and setting a lead frame 6 having an electronic component 5 mounted thereto, a pot 8 arranged in bottom die 2 for supplying a resin material, a plunger 9 fit internal to pot 8 for applying pressure to resin, a resin channel 10 to allow pot 8 and upper cavity 3 to communicate with each other for transporting a melted resin material, heating means 11 and 12 provided for dies 1 and 2, respectively, ejector pins 14 and 15 ejecting and thus releasing from upper and lower cavities 3 and 4 a resin-molded body 13 molded in upper and lower cavities 3 and 4, ejector pin fitting holes 16 and 17 fitting ejector pins 14 and 15, and an air vent 18 allowing upper cavity 8 to communicate external to the die.

Furthermore, resin channel 10 is configured for example of a cull 19 and a runner and gate 20 provided in the top die opposite to pot 8 for dispensing melted resin.

Figure 2:
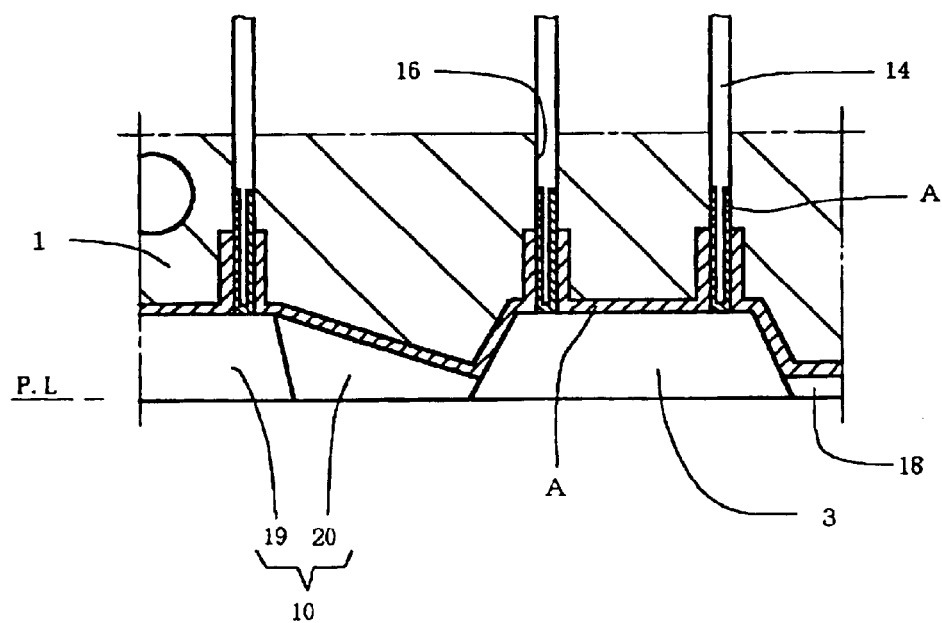
FIG. 2 is an enlarged, schematic, partial vertical cross section of a main portion of the FIG. 1 die.

Furthermore, the die has a portion, as required, electroplated through neutral-bathing to have a plating layer A of nickel-tungsten alloy having a thickness as required, as shown in FIG. 2.

Plating layer A of nickel tungsten alloy is provided for example on the upper and lower cavities 3 and 4 internal surfaces, the resin channel 10 (cull 19 and runner and gate 20) internal surface, the air vent 18 surface, the concavity 7 surface, the pot 8 internal surface, the die's P.L plane, the plunger 9 external surface, the ejector pins 14 and 15 external surfaces, and the ejector pin fitting holes 16 and 17 internal surfaces.

As such, initially, dies 1 and 2 are heated by heating means 11 and 12 to have a temperature at which resin is molded and also lead frame 6 having electronic component 5 molded thereto is fed to bottom die 2 and set at a predetermined position thereof and a resin material R is supplied into pot 8, and bottom die 2 is moved upward to close dies 1 and 2. Thus, upper and lower cavities 3 and 4 have electronic component 5 and lead frame 6 therearound fit therein.

Then, plunger 9 can apply pressure to the resin material heated and melted in pot 8, to inject the melted resin material into upper and lower cavities 3 and 4 and thus fill the cavities with the melted resin material and also to seal and thus mold electronic component 5 and lead frame 6 therearound in upper and lower cavities 3 and 4 to mold electronic component 5 and lead frame 6 therearound internal to resin-molded body 13 corresponding in geometry to upper and lower cavities 3 and 4.

After the passage of a period of time required for curing the melted resin material, dies 1 and 2 are opened and ejector pins 14 and 15 are used to eject and thus release resin molded body 13 from upper and lower cavities 3 and 4.

There will now be presented a condition for molding a resin and a result of an experiment.

| (1) Condition for Molding Resin | |
|---|---|
| i. Die Temperature | 180° C. |
| ii. Injection Pressure | 9.807 MPa |
| iii. Injection Rate | 21 mm/5 sec |
| iv. Resin Material | epoxy resin (with no mold release agent added) |
| v. Die Material | SKD-11 |
| vi. Die Surface Processing | nickel-tungsten alloy plating (NiW), compared with hard chromium plating (HCr) |
| vii. Thickness of the Plating Layer | 5 μm |

Note that the nickel-tungsten alloy plating (NiW) had a variable tungsten content of 20% by weight, 40% by weight and 60% by weight for a total of three different tungsten contents.

(2) Result of Experiment

Under the above condition for molding a resin an experiment was conducted and there was obtained a result, as presented in Table 1 below:

TABLE 1

Result of experiment presenting initial, mold release force value

| Surface processing | W (% by weight) | Initial, mold release force (unit: Pa) |
|---|---|---|
| NiW20 | 20 | 0 to $1.961 \times 10^3$ |
| NiW40 | 40 | 0 to $9.807 \times 10^2$ |
| NiW60 | 60 | 0 to $9.807 \times 10^2$ |
| HCr | | $3.923 \times 10^5$ to $5.884 \times 10^5$ |

Note that an initial, mold release force represents a minimal ejection force required to eject and thus release a resin-molded body from a die cavity.

More specifically, as presented in Table 1, for a surface processed by plating with hard chromium. (HCr) an initial, mold release force of $3.923 \times 10^5$ to $5.884 \times 10^5$ Pa is required, whereas for a surface processed by plating with various nickel-tungsten alloys (NiW) an initial, mold release force of a significantly low value is only required. For example, for a surface processed by NiW 40 with 40% by weight of W, an initial, mold release force of 0 to $9.807 \times 10^2$ Pa was required.

As such, if the die of the present embodiment is used for resin-sealing and molding, with a surface processed with NiW and thus allowing an initial, mold release force of an extremely small value, resin-molded body 13 can be efficiently released from die cavities 3 and 4 and the die can also be efficiently prevented from, having resin flash adhering to its P.L plane and the like.

Furthermore, since resin molded body 13 can be efficiently released from die cavities 3 and 4 and resin flash remaining and thus adhering to the cavities can be removed readily and in a short period of time, a product can be produced at a high level of productivity.

Furthermore, since the die can be efficiently prevented from having resin flash adhering to its P.L plane and the like the aforementioned problems attributed to such resin flash (the resin flash affecting a size of a product and introduced into the product) can be resolved to provide a high quality product that is highly reliable.

Note that if a die surface is provided with a NiW layer a resin material used for resin-sealing and molding is not required to have a mold release agent compounded therewith.

(3) Estimation of Hardness

Table 2 represents a result of an experiment for microVickers hardness to estimate the hardness of a processed surface of each die that is obtained from the above experiment.

TABLE 2

Result of experiment for microVickers hardness (Hv. 10 g)

| surface processing | W (% by weight) | microVickers hardness |
|---|---|---|
| NiW20 | 20 | 1250 to 1350 |
| NiW40 | 40 | 1300 to 1400 |
| NiW60 | 60 | 1300 to 1400 |
| HCr | | 1000 to 1100 |

Note that microVickers hardness is an index representing a hardness of a die surface.

More specifically, as presented in Table 2, a surface processed with HCr has a microVickers hardness of 1000 to 1100, whereas a surface processed with various NiW has a higher microVickers hardness. For example, a surface processed with NiW with 40% by weight of W has a microVickers hardness of 1300 to 1400.

As such, if the die of the present embodiment is used for resin-sealing and molding, it has a level of durability higher than a surface processed with HCr. As such, the die can be used for molding more frequently to produce products at a high level of productivity.

Note that in the above embodiment, simply providing a nickel-tungsten alloy plating layer on the resin-sealing and molding die on at least a surface contacting a melted resin material, can resolve a disadvantage attributed to resin adhering to the die, to achieve an effect similar to the above effect for example with respect to the improvement in the releaseability of a resin-molded body.

For example, plating layer A of nickel-tungsten alloy can be applied at least on the upper and lower cavities 3 and 4 internal surfaces.

Furthermore, if the pot 8 internal surface and the plunger 9 external surface are plated with nickel-tungsten alloy, there can be provided better releaseability between a surface processed with NiW and resin flash and the pot 8 internal surface and the plunger 9 external surface can thus be efficiently prevented from such resin flash from adhering thereto and the plunger can also be efficiently prevented from sliding improperly due to such resin flash.

Furthermore, if ejector pins 14 and 15 and the fitting holes 16 and 17 internal surfaces are plated with nickel-tungsten alloy, there can be provided better releaseability between a surface processed with NiW and resin flash and ejector pins 14 and 15 and the fitting holes 16 and 17 internal surfaces can thus be efficiently prevented from such resin flash adhering thereto and ejector pins 14 and 15 can also be efficiently prevented from sliding improperly due to such resin flash.

Furthermore in the above embodiment the ejector pin can be dispensed with. In this example, as seen in the example with the die provided with an ejector pin, there can be provided better releaseability between a surface processed with NiW and a resin molded body or the like to readily extract the resin molded body from the die cavities. Thus, a high quality product that is highly reliable can be produced at a high level of productivity.

While the embodiment uses a thermosetting resin material, it may alternatively use a thermoplastic resin material and various types of resin material.

While in the embodiment a lead frame (a substrate made of metal) is employed, the present invention is applicable to a printed circuit board referred to as a so-called PC board of plastic and substrates of various types of material.

Furthermore, at a temperature at which resin is molded, a surface processed with HCr tends to have a dropping hardness, whereas a surface processed with NiW has a hardness with a low level of temperature dependency and it thus has a stable hardness.

Furthermore, the surfaces were subjected to a scratching test, and a surface processed with HCr is readily abraded to expose a mother material of the die, whereas a surface processed with NiW, having a hard, intermediate diffusion layer, is not abraded to expose a mother material of the die so much as that processed with HCr.

Furthermore, a surface processed with HCr readily cracks while the surface is thus processed, and in resin-molding, resin enters and cures for example in an undercut crack to degrade the releaseability of a resin-molded body.

In contrast, a surface processed with NiW hardly cracks and thus provides superior releaseability of a resin-molded body to a surface processed with HCr.

Furthermore, a surface processed with NiW is higher in uniform electroconductivity than a surface processed with HCr. As such there can be reliably provided a plating layer having a uniform thickness for example of 5 $\mu$m.

Furthermore, while the embodiment employs a NiW layer having a thickness of 5 $\mu$m, in accordance with the purpose of the present invention it can employ a NiW layer having a thickness no more than or no less than 5 $\mu$m.

Furthermore, to stabilize a NiW layer provided on a die surface the NiW layer provided on the die surface (a die material) through electroplating is heated in the air and thus cured, although the NiW layer thus processed readily has a surface with an oxide film thereon and this requires a step of removing the oxide film.

However, if the heating and curing process is provided in a vacuum and gaseous nitrogen is also used to cool (the die material provided with the NiW layer) the die surface can be provided with a reliable NiW layer to eliminate the step of removing the oxide film.

Furthermore, if the resin-sealing and molding die is frequently used for molding and its surface is abraded, the surface can again be provided with a NiW layer and the die can also again provide resin-sealing and molding.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A die used for sealing and molding an electronic component with a resin material, said die comprising:
   a fixed die;
   a movable die arranged opposite to the fixed die;
   upper and lower cavities provided in said fixed die and said movable die in respective die planes thereof to face each other along a parting-line plane of said fixed die and said movable die, for molding the resin material;
   a concavity receiving and setting a support having the electronic component mounted thereto;
   a pot arranged at one of said fixed die and said movable die for supplying the resin material;
   a plunger fit internal to said pot for applying pressure to the resin material; and
   a resin channel to allow said pot and said upper cavity to communicate with each other for transporting the resin material in the melted state; and
   having a coating layer consisting of a nickel-tungsten alloy on at least a surface thereof contacting the resin material in a melted state when the resin material is molded, wherein said at least a surface includes an internal surface of said upper and lower cavities, an internal surface of said resin channel, an internal surface of said concavity, an internal surface of said pot, said parting-line lane of each of said fixed die and said movable die, and an external surface of said plunger;
   wherein said coating layer is a plating layer formed of said nickel-tungsten alloy, which contains more than 20% by weight and less than 44% by weight of tungsten.

2. The die of claim 1, wherein said coating layer is 1 $\mu$m to 20 $\mu$m in thickness.

3. The die of claim 1, further comprising an ejector pin ejecting and releasing from said upper and lower cavities a resin-molded body molded in said upper and lower cavities, and an ejector pin fitting hole fitting said ejector pin therein, wherein said ejector pin has an external surface further provided with said coating layer and/or said ejector pin fitting hole has an internal surface further provided with said coating layer.

4. The die of claim 1, wherein said resin channel includes a cull and a runner and gate arranged opposite to said pot for dispensing the resin material in the melted state, said cull and said runner and gate having an internal surface further provided with said coating layer.

5. The die of claim 1, further comprising an air vent allowing said upper cavity to communicate external to the die, said air vent having a surface further provided with said coating layer.

6. The die of claim 1, wherein said nickel-tungsten alloy contains at most 40% by weight of said tungsten.

7. The die of claim 6, wherein said coating layer has a thickness of 1 $\mu$m to 20 $\mu$m.

8. A die arrangement used for sealing and molding an electronic component with a resin material, said die arrangement comprising:
   a fixed die;
   a movable die arranged opposite to the fixed die;
   upper and lower cavities provided in said fixed die and said movable die in respective die planes thereof to a face each other along a parting-line plane of said fixed die and said movable die, for molding the resin material;
   a concavity receiving and setting a support having the electronic component mounted thereto;
   a pot arranged at one of said fixed die and said movable die for supplying the resin material;
   a plunger fit internal to said pot for applying pressure to the resin material;
   a resin channel to allow said pot and said upper cavity to communicate with each other for transporting the resin material in the melted state; and a coating layer of a nickel-tungsten alloy that is provided on surfaces of said die arrangement contacting the resin material in a melted state when the resin material is molded, wherein said surfaces include an internal surface of said upper and lower cavities, an internal surface of said resin channel, an internal surface of said concavity, an internal surface of said pot, said parting-line plane of each of said fixed die and said movable die, and an external surface of said plunger, and wherein said coating layer is a plating layer formed of said nickel-tungsten alloy, which contains at least 20% by weight and at most 60% by weight of tungsten.

9. The die of claim 8, further comprising an ejector pin ejecting and releasing from said upper and lower cavities a resin-molded body molded in said upper and lower cavities, and an ejector pin fitting hole fitting said ejector pin therein, wherein said ejector pin has an external surface provided with said coating layer and/or said ejector pin fitting hole has an internal surface provided with said coating layer.

10. The die of claim 8, wherein said resin channel includes a cull and a runner and gate arranged opposite to said pot for dispensing the resin material in the melted state, said cull and said runner and gate having an internal surface provided with said coating layer.

11. The die of claim 8, further comprising an air vent allowing said upper cavity to communicate external to the die, said air vent having a surface provided with said coating layer.

* * * * *